US 9,973,105 B2

(12) United States Patent
Mehringer et al.

(10) Patent No.: US 9,973,105 B2
(45) Date of Patent: May 15, 2018

(54) HALF BRIDGE FOR AN ACTIVE RECTIFIER HAVING AN OVERVOLTAGE PROTECTION

(71) Applicant: SEG AUTOMOTIVE GERMANY GMBH, Stuttgart (DE)

(72) Inventors: Paul Mehringer, Stuttgart (DE); Zoltan Kosznai, Budapest (HU); Petra Rose, Tuebingen (DE); Zoltan Balazs, Budapest (HU)

(73) Assignee: SEG AUTOMOTIVE GERMANY GMBH, Stuttgart (DE)

( * ) Notice: Subject to any disclaimer, the term of this patent is extended or adjusted under 35 U.S.C. 154(b) by 0 days. days.

(21) Appl. No.: 15/029,563

(22) PCT Filed: Oct. 17, 2014

(86) PCT No.: PCT/EP2014/072365
§ 371 (c)(1),
(2) Date: Apr. 14, 2016

(87) PCT Pub. No.: WO2015/059059
PCT Pub. Date: Apr. 30, 2015

(65) Prior Publication Data
US 2016/0276952 A1 Sep. 22, 2016

(30) Foreign Application Priority Data
Oct. 21, 2013 (DE) .......................... 10 2013 221 322

(51) Int. Cl.
H02M 7/04 (2006.01)
H02M 7/06 (2006.01)
(Continued)

(52) U.S. Cl.
CPC .............. *H02M 7/04* (2013.01); *H02M 1/32* (2013.01); *H02M 7/06* (2013.01); *H03K 17/082* (2013.01);
(Continued)

(58) Field of Classification Search
CPC ...................................................... H02M 7/04
See application file for complete search history.

(56) References Cited

U.S. PATENT DOCUMENTS 4,519,024 A    5/1985   Federico et al.
5,559,656 A    9/1996   Chokhawala
(Continued)

FOREIGN PATENT DOCUMENTS

DE    103 36 237 A1     3/2005
DE    102007060219      6/2009
(Continued)

OTHER PUBLICATIONS

Zhong, W.X. et al., "Generalized self-driven AC-DC synchronous rectification techniques for single- & multiphase systems", 2010 International Power Electronics Conference: IPEC-Sapporo 2010; Sapporo, Japan, IEEE, Piscataway, NJ, USA, Jun. 21, 2010, pp. 2098-2105, XP031729009.
(Continued)

*Primary Examiner* — Jue Zhang
*Assistant Examiner* — Trinh Q Dang
(74) *Attorney, Agent, or Firm* — Norton Rose Fulbright US LLP; Gerard A. Messina

(57) ABSTRACT

A half bridge for an active rectifier having an alternating-voltage connection, a positive direct-voltage connection, as well as a ground connection, a first switch element connecting the alternating-voltage connection to the ground connection; a second switch element connecting the alternating-voltage connection to the positive direct-voltage connection, a first control element being connected to the first switch element for switching the first switch element; a connection of a first capacitor being connected to a voltage supply connection of the first control element; the positive direct-voltage connection being connected via a first diode in the forward direction to the one connection of the first capacitor; the first capacitor being connected in parallel to a series connection of the first switch element and the second switch element.

9 Claims, 3 Drawing Sheets

(51) Int. Cl.
*H03K 17/082* (2006.01)
*H02M 1/32* (2007.01)
*H03K 17/081* (2006.01)
*H03K 17/30* (2006.01)

(52) U.S. Cl.
CPC . *H03K 17/08104* (2013.01); *H03K 2017/307* (2013.01); *H03K 2217/0081* (2013.01)

(56) References Cited

U.S. PATENT DOCUMENTS

| | | | |
|---|---|---|---|
| 6,747,880 | B2 | 6/2004 | Grover |
| 8,913,409 | B2 | 12/2014 | Hui et al. |
| 2002/0141214 | A1 | 10/2002 | Grover |
| 2011/0199799 | A1 | 8/2011 | Hui |
| 2012/0268084 | A1* | 10/2012 | Wang ................ H02M 1/4225 323/208 |
| 2012/0294053 | A1* | 11/2012 | Yan ........................ H02M 1/32 363/53 |
| 2014/0369101 | A1* | 12/2014 | Nguyen ................ H02M 1/084 363/127 |

FOREIGN PATENT DOCUMENTS

| | | |
|---|---|---|
| DE | 102009046955 | 5/2011 |
| DE | 102011051447 | 1/2012 |
| DE | 10 2012 201 860 A1 | 8/2012 |
| DE | 10 2012 208 458 A1 | 11/2013 |

OTHER PUBLICATIONS

International Search Report for PCT/EP2014/072365 dated Jan. 27, 2014.

* cited by examiner

HALF BRIDGE FOR AN ACTIVE RECTIFIER HAVING AN OVERVOLTAGE PROTECTION

FIELD

The present invention relates to a half bridge for an active rectifier, in particular having an overvoltage protection.

BACKGROUND INFORMATION

Rectifiers of different types of construction may be used for supplying direct-current systems from three-phase systems. The present application relates to active or controlled bridge rectifiers, which have active switch elements, for example in the form of known metal-oxide-semiconductor-field-effect transistors (MOSFETs). In motor vehicle electrical systems, bridge rectifiers of a six-pulse design are frequently used in accordance with the three-phase generators normally installed in motor vehicles. The present invention, however, is equally suitable for bridge rectifiers for other phase numbers, e.g., for five-phase generators, and in other usage scenarios.

As explained for example in German Patent Application DE 10 2009 04 6 955 A1, the use of active bridge rectifiers in motor vehicles is desirable, inter alia, because these, in contrast to passive or non-controlled bridge rectifiers, have lower power losses.

A critical case of a fault, however, particularly in active bridge rectifiers, is the load dump. This occurs when, in the case of a highly excited generator and a correspondingly high output current, the load on the generator suddenly drops (e.g., when consumers are switched off) and if this is not absorbed by capacitively acting elements in the direct-current network (e.g. the battery in the motor vehicle electrical system).

Here, in the extreme case, it is possible that the generator continues to supply energy into the network up to a duration of approx. 300 to 500 ms. This must be able to be converted (extinguished) in the bridge rectifier in order to protect electrical components connected in outgoing circuit against overvoltage damage. In passive or non-controlled bridge rectifiers, this protection is normally provided by the rectifier diodes themselves because there the energy loss is able to be converted into heat. In currently available active switch elements, however, for example MOSFETs, it is not possible to emulate these properties completely. Additional protection strategies are therefore required.

In the event of a load dump, for example, some or all phases may be short-circuited by switching the associated switch elements to ground (that is, low side). The ensuing voltage drop, however, may have the result that the energy supply for controlling the switch elements can no longer be provided. In particular, it is no longer possible to reload bootstrap capacitors used for this purpose, particularly in the low side path.

It is therefore desirable to indicate a possibility so that an active rectifier having an overvoltage protection still functions even after switching a short circuit.

SUMMARY

An example half bridge in accordance with the present invention for an active rectifier includes a first controllable switch element, via which an alternating-voltage connection of the half bridge is connected to a ground connection of the half bridge (low-side path), and a first control element for controlling the first switch element. A first capacitor used for a voltage supply of the first control element is advantageously supplied via a positive direct-voltage connection of the half bridge.

This ensures a voltage supply even when first switch element actively establishes a short circuit between the alternating-voltage connection and the ground connection.

It is furthermore advantageous if the half bridge has a second controllable switch element, via which the alternating-voltage connection is connected to the positive direct-voltage connection, as well as a second control element for controlling the second switch element. A second capacitor used for a voltage supply of the second control element is likewise advantageously supplied from the positive direct-voltage connection. A voltage supply is thereby also ensured for the second capacitor and is not limited in the case of a short circuit.

Preferably, a half bridge furthermore has a third control element, which closes the first switch element in the event of an overvoltage between the positive direct-voltage connection and the ground connection (so-called active short circuit), the third control element being preferably likewise supplied by the first capacitor for the first control element. In this manner, the voltage supply for the first capacitor is ensured even after switching an active short circuit for protecting the active rectifier against overvoltage. The functionality of the active rectifier thereby continues to be ensured.

When switching the active short circuit, a voltage drop may occur on the positive direct-voltage connection as a result of a current drop on the alternating-voltage connection. Since the active short circuit is triggered via the third control element, ensuring the voltage supply of the third control element is of high importance precisely at this time, since otherwise the control of the first switch element and thus the maintenance of the active short circuit cannot be ensured. By a first diode, via which in the forward direction the positive direct-voltage connection is connected to the connection of the first capacitor, the first capacitor is decoupled from the voltage drop on the positive direct-voltage connection. This ensures, however, that even in the event of a brief voltage drop on the positive direct-voltage connection, the voltage supply of the third control element is provided.

Further advantages and developments of the present invention derive from the description and the enclosed drawing.

It is understood that the features mentioned above and the features yet to be explained below may be used not only in the combination indicated in each case but also in other combinations or in isolation, without departing from the scope of the present invention.

The present invention is represented schematically in the figures on the basis of exemplary embodiments and described in detail below with reference to the figures.

DETAILED DESCRIPTION OF EXAMPLE EMBODIMENTS

Figure 1:
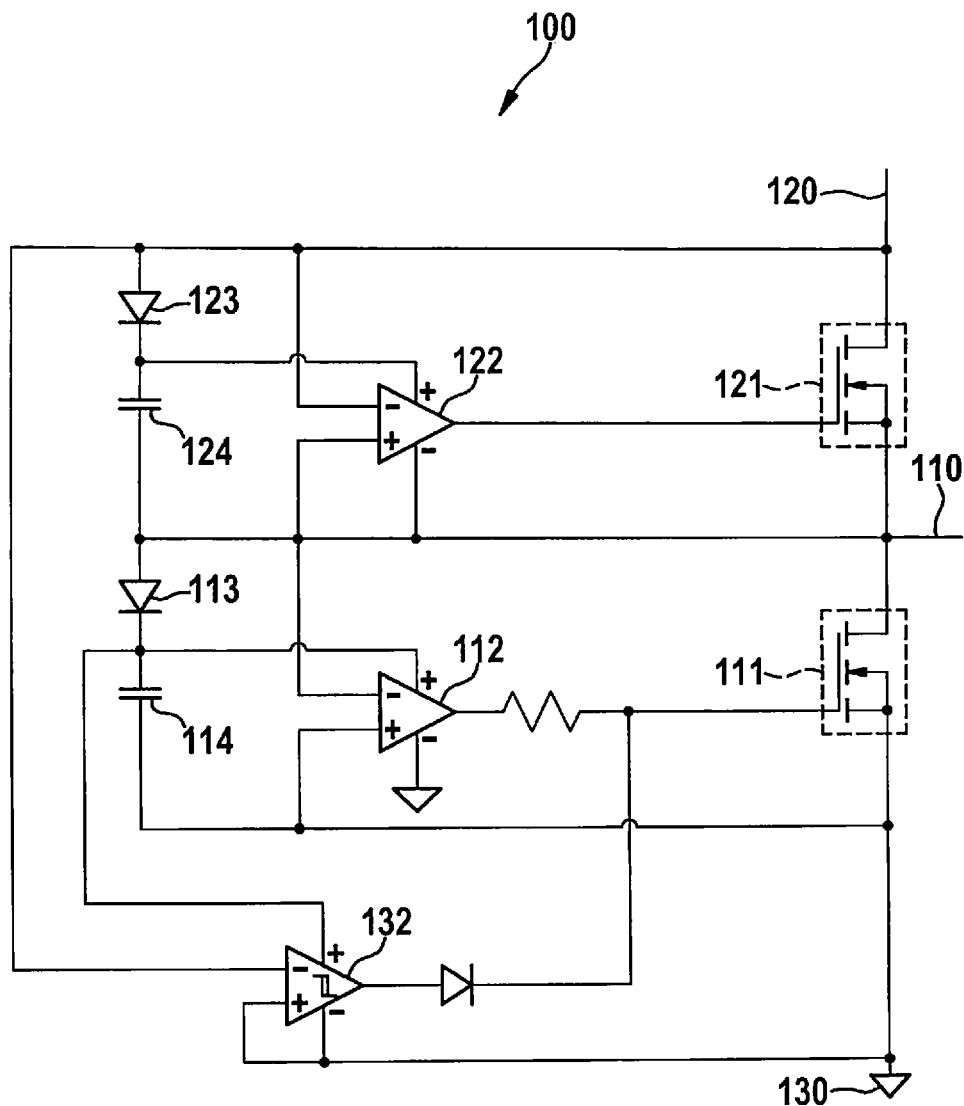
FIG. 1 schematically shows a half bridge of an active rectifier having an overvoltage protection (not in accordance with the present invention).

FIG. 1 schematically shows a circuit, not in accordance with the present invention, for a half bridge 100 of an active rectifier having an overvoltage protection. Half bridge 100 includes an alternating-voltage connection 110, a positive direct-voltage connection 120 and a ground connection 130.

Via a first switch element 111, for example a MOSFET, alternating-voltage connection 110 is connected to ground connection 130 (low side). Via a second switch element 121, for example likewise a MOSFET, alternating-voltage connection 110 is connected to the positive direct-voltage connection 120 (high side).

First switch element 111 is controlled by a first control element 112, for example an amplifier. A voltage supply for first control element 112 is a first capacitor 114, which is connected to first control element 112, together with a connection to ground (bootstrap principle). Via a first diode 113, first capacitor 114 is connected to alternating-voltage connection 110, via which first capacitor 114 is supplied. First diode 113 is connected in such a way that only one current direction from alternating-voltage connection 110 to first capacitor 114 is possible. On the other side, the first capacitor has a connection to ground.

Second switch element 121 is controlled by a second control element 122, for example likewise an amplifier. A voltage supply for second control element 122 is a second capacitor 124, which is connected to second control element 122, together with a connection to alternating-voltage connection 110. Via a second diode 123, second capacitor 124 is connected to the positive direct-voltage connection 120, via which first capacitor 114 is supplied. Second diode 113 is connected in such a way that only a current direction from positive direct-voltage connection 120 to second capacitor 124 is possible. On the other side, the second capacitor is connected to alternating-voltage connection 110.

This manner of interconnection allows for a synchronous rectification, i.e., the switch elements switch generally synchronously with a polarity reversal of the alternating voltage. In order to avoid an unintended short circuit (i.e., both switch elements are conductive), an inductance is connected on the output of first control element 112, which results in a delayed switching of first switch element 111.

Additionally, half bridge 100 has a third control element 132, for example an hysteresis element (i.e., switch-on and switch-off thresholds differ). Third control element 132 measures a voltage between positive direct-voltage connection 120 and ground connection 130, with which measuring inputs of third control element 132 are respectively connected. A voltage supply for third control element 132 occurs via first capacitor 114, together with a connection to ground. Third control element 132 closes first switch element 111 if the voltage between positive direct-voltage connection 120 and ground connection 130 exceeds an upper threshold value (switch-on threshold).

This produces an active short circuit from alternating-voltage connection 110 to ground connection 130, while alternating-voltage connection 110 may also be connected to positive direct-voltage connection 120. An overvoltage on direct-voltage connection 110, whereby a possible consumer could be damaged, is thereby reduced.

This has the consequence, however, that first capacitor 114 is no longer supplied from alternating-voltage connection 110, since this is now short-circuited. Thus, first switch element 11 can no longer be controlled since the first capacitor is no longer able to supply voltage to the first control element. Half bridge 100 no longer functions.

Figure 2:
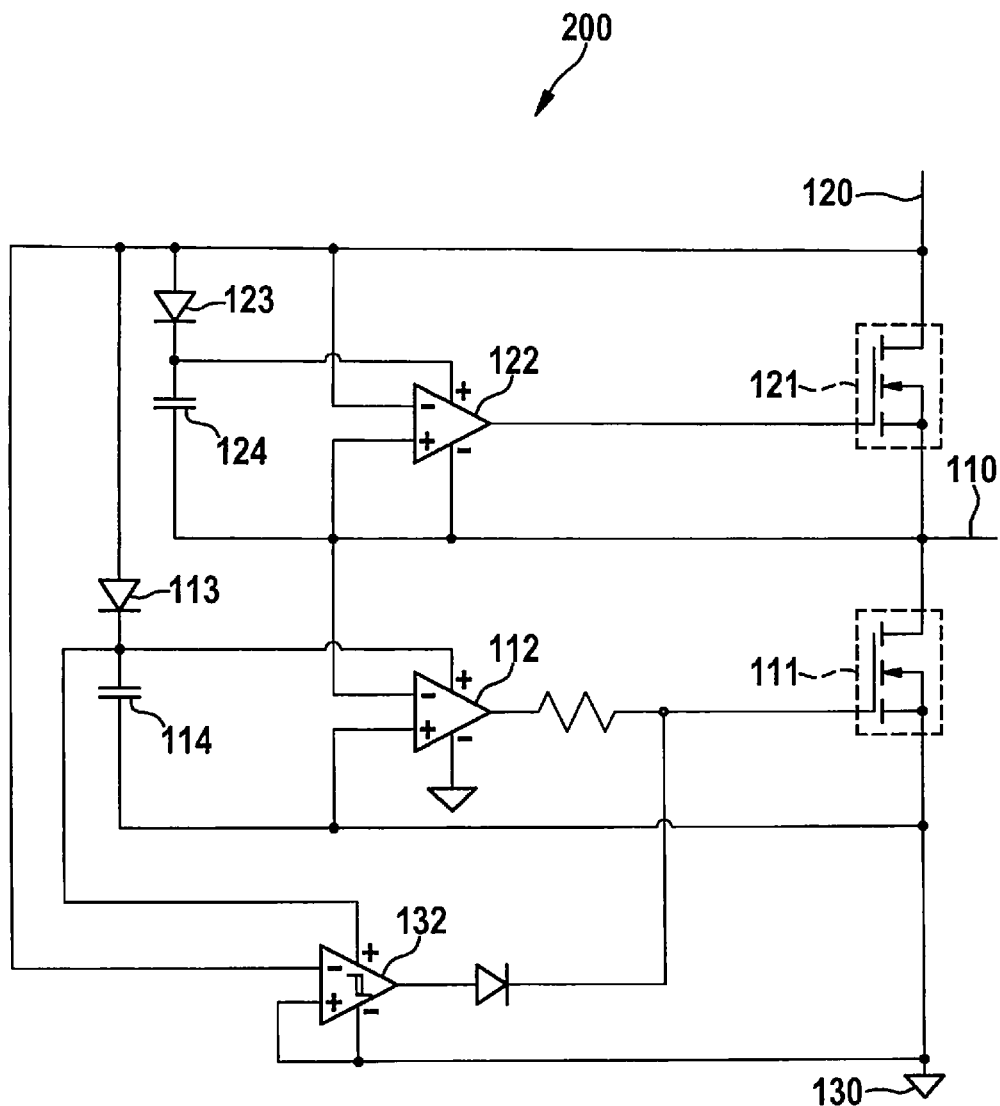
FIG. 2 schematically shows a half bridge of an active rectifier having an overvoltage protection in a preferred embodiment of a system in accordance with an example embodiment of the present invention.

To remedy this problem, the present invention provides for an alternative interconnection of first capacitor 114, as shown in FIG. 2. FIG. 2 schematically shows a half bridge 200 of an active rectifier having an overvoltage protection in a preferred embodiment of a system in accordance with the present invention. The circuit includes the same elements as the circuit in FIG. 1, and the elements consequently have the same reference symbols in the text below.

In contrast to the embodiment shown in FIG. 1, however, in half bridge 200, first capacitor 114 is connected via first diode 113 to positive direct current connection 120, via which first capacitor 114 is supplied. First diode 113 is connected in such a way that only a current direction from positive direct-voltage connection 120 to first capacitor 114 is possible. On the other side, the first capacitor has a connection to ground. In particular, first capacitor 114 is thereby connected in parallel to a series connection of first switch element 111 and second switch element 121, whereas in the specific embodiment shown in FIG. 1, it is connected in parallel only to first switch element 111 such that there a charging of the first capacitor is prevented by closure of the first switch element 111.

If third control element 132 in the event of an overvoltage now establishes an active short circuit from alternating-voltage connection 110 to ground connection 130, while alternating-voltage connection 110 is also connected to direct-voltage connection 120, then first capacitor 114 continues to be supplied via direct-voltage connection 120 (and thus from the vehicle electrical system). A voltage supply of first switch element 112 and thus the functioning of half bridge 200 thereby continues to be ensured.

Third control element 132 opens first switch element 111 again when the voltage between positive direct-voltage connection 120 and ground connection 130 falls below a lower threshold value (switch-off threshold).

Figure 3:
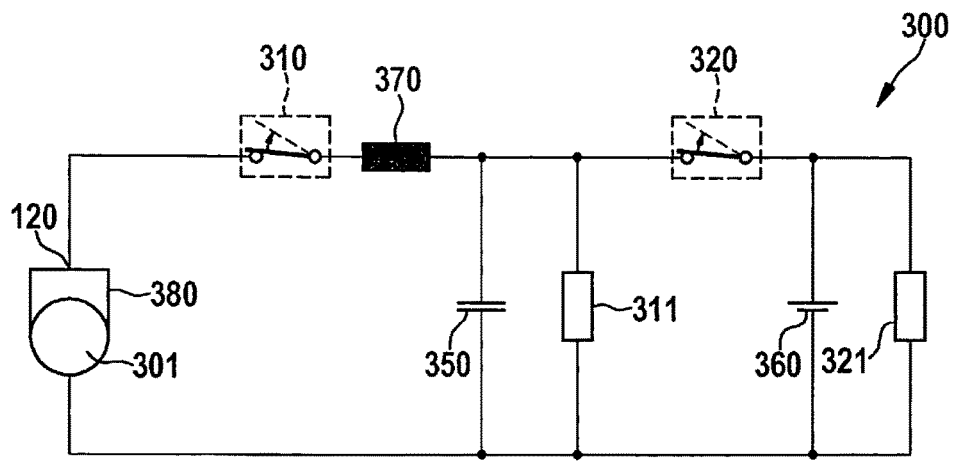
FIG. 3 schematically shows a typical design of a load dump test in a vehicle electrical system.
Figure 4:
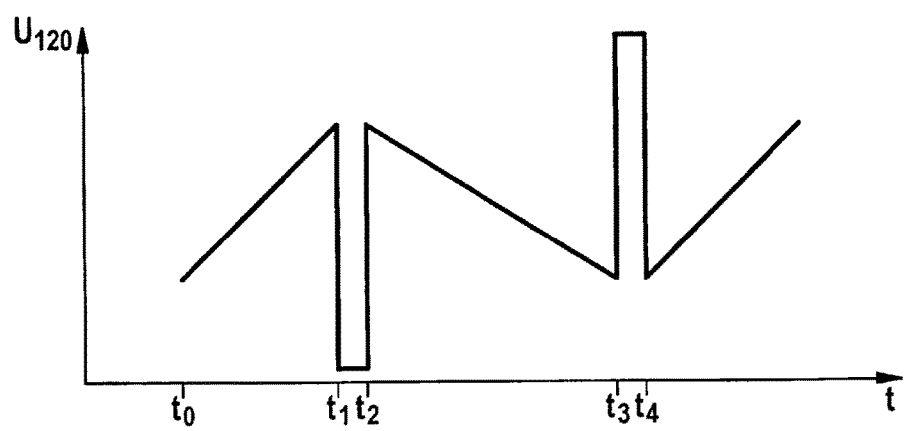
FIG. 4 schematically shows a typical curve of a voltage on a positive direct-voltage connection of an active rectifier having half bridges in accordance with a preferred embodiment of the present invention in the event of a load dump.

When switching the active short circuit, a voltage drop may occur on positive direct-voltage connection 120 as a result of a current drop on alternating-voltage connection 110 or as a result of a vehicle electrical system inductance (see FIGS. 3 and 4). Since the active short circuit is triggered via the third control element 132, ensuring the voltage supply of third control element 132 is of high importance precisely at this time, since otherwise the control of first switch element 111 and thus the maintenance of the active short circuit cannot be ensured. First capacitor 114 is decoupled by first diode 113 from the voltage drop on positive direct-voltage connection 120. This ensures that even in the event of a brief voltage drop on the positive direct-voltage connection 120, the voltage supply of third control element 132 is provided.

In dimensioning control element 132, it is expedient to respect a capacity that ensures the voltage supply during the voltage drop.

FIG. 3 schematically shows a vehicle electrical system 300, for example a vehicle, which has a generator 301 having a synchronous active rectifier 380, which includes multiple half bridges in accordance with the present invention, such as shown in FIG. 2 for example. The positive direct-voltage connection 120 is likewise shown.

Vehicle electrical system 300 includes an energy store 360, for example a vehicle battery, as well as two consumers 311 and 321. An inductance of the components (e.g., lines) of the vehicle electrical system is indicated by 370, and a capacitance by 350.

System 300 furthermore includes two switches 310 and 320, by which an electrical connection of the two consumers to the synchronous active rectifier 380 may be established or interrupted.

Opening switch 320 for example separates consumer 321 and battery 360 for performing a load dump test of positive direct-voltage connection 120. As a result, voltage $U_{120}$ on positive direct-voltage connection 120 rises. This is shown in FIG. 4 in a rough schematic manner beginning at to.

When the upper threshold value is exceeded, the active short circuit is switched. This is shown in FIG. 4 in a rough schematic manner beginning at $t_1$. Due to the vehicle electrical system inductance, an inductance peak arises until at $t_2$ the inductance is extinguished. Subsequently, voltage $U_{120}$ on positive direct-voltage connection 120 corresponds again to the vehicle electrical system voltage, which is generally determined by vehicle electrical system capacitance 350.

This is now discharging until at $t_3$ the lower threshold value is undershot and the active short circuit is accordingly canceled again. Due to the vehicle electrical system inductance, an inductance peak arises again until at $t_4$ the inductance is extinguished etc.

What is claimed is:

1. A half bridge for an active rectifier, comprising:
an alternating-voltage connection;
a positive direct-voltage connection;
a ground connection;
a first switch element connecting the alternating-voltage connection to the ground connection;
a second switch element connecting the alternating-voltage connection to the positive direct-voltage connection;
a first control element connected to the first switch element to switch the first switch element; and
a first capacitor, a connection of the first capacitor being connected to a voltage supply connection of the first control element;
wherein the positive direct-voltage connection is connected via a first diode in the forward direction to the connection of the first capacitor, and the first capacitor, together with the first diode, is connected in parallel to a series connection of the first switch element and the second switch element.

2. The half bridge as recited in claim 1, further comprising:
a second control element connected to the second switch element to switch the second switch element; and
a second capacitor, a connection of the second capacitor being connected to a voltage supply connection of the second control element;
wherein the positive direct-voltage connection is connected via a second diode in the forward direction to the connection of the second capacitor.

3. The half bridge as recited in claim 1, further comprising:
a third control element, a first test port of the third control element being connected to the positive direct-voltage connection, and a second test port of the third control element being connected to the ground connection, the third control element being connected to the first switch element and being designed to close the first switch element if the voltage between the first test port and the second test port exceeds a threshold value.

4. The half bridge as recited in claim 1, wherein the first switch element is a MOSFET.

5. The half bridge as recited in claim 1, wherein the first control element is an amplifier element.

6. The half bridge as recited in claim 2, wherein second switch element is a MOSFET.

7. The half bridge as recited in claim 2, wherein the second control element is an amplifier element.

8. The half bridge as recited in claim 3, wherein the connection of the first capacitor is connected to a voltage supply connection of the third control element.

9. The half bridge as recited in claim 3, wherein the third control element is a hysteresis element.

* * * * *